(12) United States Patent
Chin et al.

(10) Patent No.: US 6,408,860 B1
(45) Date of Patent: Jun. 25, 2002

(54) METHOD FOR CLEANING PHOSPHORUS FROM AN MBE CHAMBER

(75) Inventors: Patrick T. Chin, Marina del Rey; Todd K. Makishi, Harbor City; Thomas R. Block, Los Angeles, all of CA (US)

(73) Assignee: TRW Inc., Redondo Beach, CA (US)

( * ) Notice: Subject to any disclaimer, the term of this patent is extended or adjusted under 35 U.S.C. 154(b) by 111 days.

(21) Appl. No.: 09/668,104

(22) Filed: Sep. 21, 2000

(51) Int. Cl.[7] .............................. B08B 9/00; B08B 7/00
(52) U.S. Cl. ..................... 134/22.1; 134/22.15; 134/4; 134/17; 134/42
(58) Field of Search ................. 134/4, 17, 42, 134/11, 22.1, 22.15, 31, 37; 438/905

(56) References Cited

U.S. PATENT DOCUMENTS

| | | | |
|---|---|---|---|
| 4,512,812 A | * 4/1985 | Liebert et al. ................ | 134/21 |
| 5,759,287 A | * 6/1998 | Chen et al. .................... | 134/21 |
| 5,843,239 A | * 12/1998 | Shrotriya ..................... | 134/1.1 |
| 5,882,424 A | * 3/1999 | Taylor et al. .................. | 134/1 |
| 5,988,187 A | * 11/1999 | Trussell et al. ............... | 134/1.1 |
| 6,309,460 B1 | * 10/2001 | Makishi ........................ | 117/200 |

* cited by examiner

Primary Examiner—Randy Gulakowski
Assistant Examiner—Saeed Chaudhry
(74) Attorney, Agent, or Firm—Antonelli, Terry, Stout & Kraus, LLP

(57) ABSTRACT

A method for cleaning phosphorus from a MBE vacuum chamber by freezing the panel (22) placed within the vacuum chamber (10) onto which excess phosphorus is deposited. The panel is connected to a source of cold nitrogen (24) which cools the panel. Water is introduced after the panels are cooled so as to form a layer of ice on top of the phosphorus. The panel may then be removed for cleaning with ice covering the phosphorus without danger of ignition of the phosphorus.

5 Claims, 1 Drawing Sheet

METHOD FOR CLEANING PHOSPHORUS FROM AN MBE CHAMBER

BACKGROUND OF THE INVENTION

1. Field of the Invention

This invention relates generally to a method for cleaning phosphorus from an MBE vacuum chamber and more specifically to a method for removing phosphorus from an MBE vacuum chamber safely and effectively by encasing it in frost on a panel in the chamber.

2. Discussion of the Background

In molecular beam epitaxy (MBE), materials are deposited on a substrate in a vacuum chamber. A number of different types of materials are used including phosphorus. One of the unfortunate properties of phosphorus, however, is that it is very flammable. While the phosphorus is being deposited on the substrate within the MBE vacuum chamber, much of the phosphorus is also deposited on the walls of the chamber and other fixtures or apparatus elements within the chamber. This presents a very real fire hazard when the chamber is opened for cleaning and maintenance.

First, there is the danger that since the phosphorus is flammable that it may be easily ignited. Further, in order to remove the phosphorus, it is necessary to scrape it out. The friction or sparks caused by scraping can ignite the phosphorus while the operator is performing the operation. If a solvent, such as methanol, is used, the operator is then exposed to even higher fire hazard. Thus, the traditional method (scraping and solvent wipe) is clearly incompatible with phosphorous and new techniques for removal are necessary.

SUMMARY OF THE INVENTION

It is an object of this invention to provide a safe and efficient method of cleaning phosphorus from a vacuum chamber.

It is another object of this invention to provide a novel system for removing phosphorus and other dangerous chemicals from an MBE vacuum chamber without introducing unwanted materials.

It is a further object of,this invention to provide a safe and effective method for cleaning phosphorus from a vacuum chamber by encasing it in frost.

Briefly, these and other objects of the invention are achieved by intentionally introducing water vapor into an MBE system while a panel inside the chamber remains cold. Phosphorus which has been deposited on the cold panel will then be covered with a layer of frost so that it can be handled and cleaned safely in a water tank. Accordingly, the use of organic solvent is avoided.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawing, wherein.

DETAILED DESCRIPTION OF THE PREFERRED EMBODIMENTS

Figure 1:
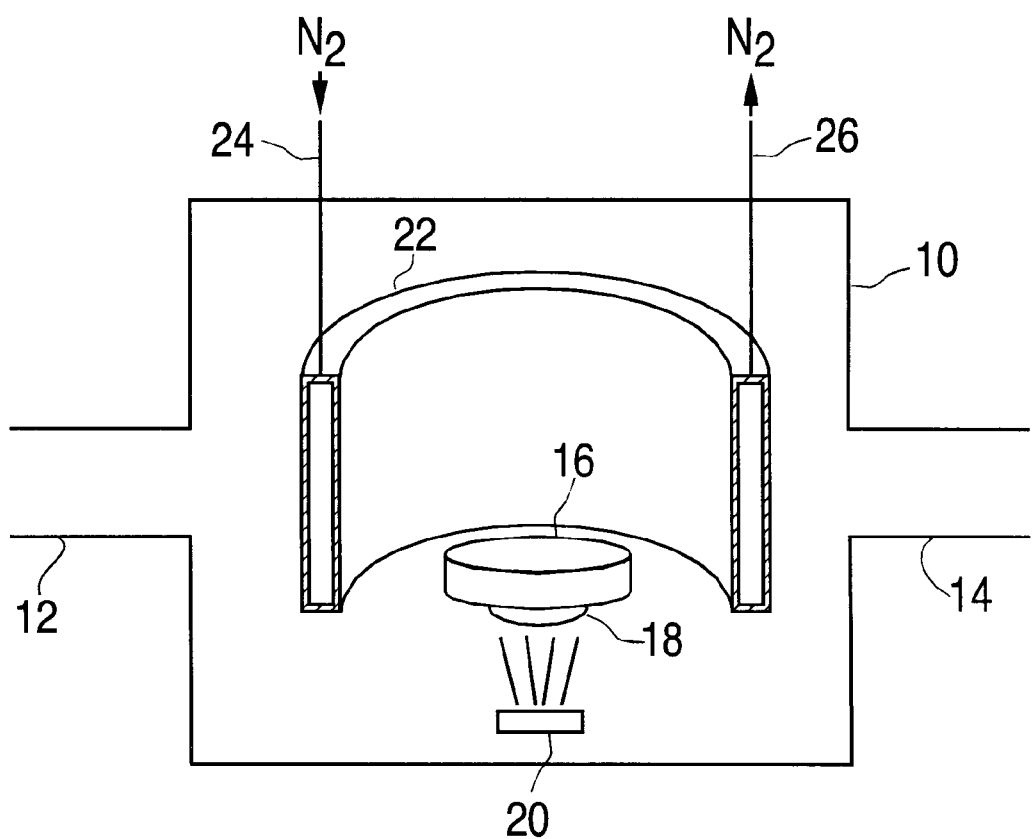
FIG. 1 is a schematic diagram of the present invention.

FIG. 1 shows a device for molecular beam epitaxy. The system includes a vacuum chamber 10 with an input port 12 and an output port 14. Various components may be introduced into port 12 and unwanted gases can be removed by vacuum through output port 14. In MBE procedures, a molecular beam is formed which is directed onto a substrate so that material can be deposited thereon. Accordingly, a holder 16 or other fixed apparatus is provided for holding a substrate 18 in position. The substrate may be held to the holder mechanically or by solder. The substrate is placed in the path of beams which are generated from a source material 20 such as phosphorus. The dimensions, separation and location of the substrate and source are arranged so that the deposit is uniform. As a result, it is inevitable that some of the beams strike other parts of the chamber, including the walls. As a result, the phosphorus or other source material is deposited in places where it is not wanted.

The present invention further includes the usage of a removable panel or internal wall 22 which is part of the MBE system, and which is made of stainless steel.

The panel is hollow and connected to a source of liquid nitrogen through an input pipe 24 during the deposition. The liquid nitrogen is then returned through output pipe 26. Liquid nitrogen is introduced into the coils as desired in order to cool the removable panel. This aids in causing the excess material to be deposited on the panel. After the deposition is complete, the flow of liquid nitrogen is stopped and the panel is filled with cold nitrogen gas by way of pipes 24 and 26. When the chamber is opened to the atmosphere, moist air enters the chamber. When the moist air comes into contact with the cold removable panel, the moisture solidifies, thus covering not only the panel but any deposited materials, including the phosphorus, with frost or ice. While moisture from the air is usually sufficient to accomplish this, it would also be possible to introduce an atmosphere into the chamber with a high level of water vapor. It would also be possible to have a sprinkler or mister introduce water into the chamber directly to accomplish the same purpose.

The main concern of using water in a high vacuum chamber is its effect on material quality. It has been demonstrated that a wafer can be removed by our standard bake out procedure and no material degradation is observed.

After the layer of solid water has been deposited, the source of nitrogen is disconnected from the coils and the panels are removed for cleaning. The panels can be carried to a cleaning area where they are placed in a polyethylene tank for cleaning. When placed in tank, the material on the cryo panel is sprayed with a high pressure dionized (DI) gun sprayer. The frost immediately dissolves and some of the phosphorus may then be cleaned by high pressure DI water spray, a standard procedure, or by standard scraping. The water bath also prevents the phosphorus from coming into contact with the air, thus lowering the fire hazard.

While this device has been described in terms of a vacuum chamber for MBE, it is clearly applicable to any type of chamber, whether vacuum or not, where a material is deposited and must be removed. Also, while this system has been described in regard to phosphorus, it would clearly be applicable to any other material, especially any material which is dangerous to handle.

Obviously, numerous additional modifications and variations of the present invention are possible in light of the above teachings. It is therefore, to be understood that within the scope of the appended claims, the invention may be practiced otherwise than as specifically described herein.

What is claimed is:

1. A method for removing deposits from a chamber comprising the steps of:
   providing a panel within the chamber onto which deposits are formed;
   cooling said panel;
   introducing water vapor into said chamber causing ice to form on said cooled panel;
   removing said panel from said chamber while covered with ice; and
   cleaning said removable panel.

2. The method according to claim 1, wherein said panel is cooled by cold nitrogen gas.

3. The method according to claim 1, wherein the vacuum chamber is an MBE process vacuum chamber.

4. The method according to claim 1, wherein said panel is removed and placed in a water tank for cleaning.

5. The method according to claim 1, wherein the chamber is an MBE vacuum chamber in which phosphorus source material is used to create molecular beams for depositing onto a substrate, with excess phosphorus being deposited on said panel.

* * * * *